United States Patent
Wu et al.

(10) Patent No.: US 10,062,764 B1
(45) Date of Patent: Aug. 28, 2018

(54) SEMICONDUCTOR DEVICE HAVING VOID BETWEEN GATE ELECTRODE AND SIDEWALL SPACER AND MANUFACTURING METHOD THEREOF

(71) Applicant: UNITED MICROELECTRONICS CORP., Hsin-Chu (TW)

(72) Inventors: Yen-Liang Wu, Taipei (TW); Wen-Tsung Chang, Tainan (TW); Jui-Ming Yang, Taichung (TW); I-Fan Chang, Hsinchu (TW); Chun-Ting Chiang, Kaohsiung (TW); Chih-Wei Lin, Kaohsiung (TW); Bo-Yu Su, Tainan (TW); Chi-Ju Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/665,397

(22) Filed: Jul. 31, 2017

(30) Foreign Application Priority Data

Jul. 3, 2017 (TW) .............................. 106122208 A

(51) Int. Cl.
| H01L 29/51 | (2006.01) |
| H01L 29/49 | (2006.01) |
| H01L 29/423 | (2006.01) |
| H01L 21/3213 | (2006.01) |
| H01L 21/28 | (2006.01) |
| H01L 29/06 | (2006.01) |
| H01L 29/08 | (2006.01) |
| H01L 29/66 | (2006.01) |
| H01L 29/78 | (2006.01) |

(52) U.S. Cl.
CPC ...... H01L 29/515 (2013.01); H01L 21/28088 (2013.01); H01L 21/32139 (2013.01); H01L 29/0649 (2013.01); H01L 29/42368 (2013.01); H01L 29/42376 (2013.01); H01L 29/4966 (2013.01); H01L 29/0847 (2013.01); H01L 29/6656 (2013.01); H01L 29/66545 (2013.01); H01L 29/66553 (2013.01); H01L 29/66568 (2013.01); H01L 29/66795 (2013.01); H01L 29/7851 (2013.01)

(58) Field of Classification Search
CPC .......... H01L 21/823431; H01L 29/515; H01L 29/4966; H01L 29/66795; H01L 29/785; H01L 29/66545
See application file for complete search history.

(56) References Cited

U.S. PATENT DOCUMENTS

| 9,263,392 B1 | 2/2016 | Lin |
| 9,337,094 B1 | 5/2016 | Pranatharthiharan |
| 9,721,897 B1 * | 8/2017 | Cheng .................. H01L 23/535 |

(Continued)

*Primary Examiner* — Tom Thomas
*Assistant Examiner* — Nilufa Rahm
(74) *Attorney, Agent, or Firm* — Winston Hsu

(57) ABSTRACT

A semiconductor device includes a substrate, a gate structure, a spacer, a mask layer, and at least one void. The gate structure is disposed on the substrate, and the gate structure includes a metal gate electrode. The spacer is disposed on sidewalls of the gate structure, and a topmost surface of the spacer is higher than a topmost surface of the metal gate electrode. The mask layer is disposed on the gate structure. At least one void is disposed in the mask layer and disposed between the metal gate electrode and the spacer.

10 Claims, 3 Drawing Sheets

(56) References Cited

U.S. PATENT DOCUMENTS

| | | | |
|---|---|---|---|
| 2015/0214220 A1* | 7/2015 | Seo | H01L 27/088 257/392 |
| 2015/0263160 A1 | 9/2015 | Xie | |
| 2016/0005731 A1 | 1/2016 | Chen | |

* cited by examiner

US 10,062,764 B1

SEMICONDUCTOR DEVICE HAVING VOID BETWEEN GATE ELECTRODE AND SIDEWALL SPACER AND MANUFACTURING METHOD THEREOF

BACKGROUND OF THE INVENTION

1. Field of the Invention

The present invention relates to a semiconductor device and a manufacturing method thereof, and more particularly, to a semiconductor device including a void and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. For instance, in a field effect transistor (FET), the distance between gate lines becomes smaller for increasing the integrity of the integrated circuit. However, under the exposure limitations of photolithography processes, it is difficult to form contact structures corresponding to source/drain structures when the spacing between the gate lines becomes extremely small, and interference and electrical influence may be problems between the contact structure and the gate line because the distance between the contact structure and the gate line is extremely small also.

SUMMARY OF THE INVENTION

A semiconductor device and a manufacturing method thereof are provided in the present invention. A void is formed in a mask layer on a gate structure and formed between a metal gate electrode and a spacer for enhancing the insulation effect between the gate structure and a contact structure corresponding to a source/drain structure.

According to an embodiment of the present invention, a semiconductor device is provided. The semiconductor device includes a substrate, a gate structure, a spacer, a mask layer, and at least one void. The gate structure is disposed on the substrate, and the gate structure includes a metal gate electrode. The spacer is disposed on sidewalls of the gate structure, and a topmost surface of the spacer is higher than a topmost surface of the metal gate electrode. The mask layer is disposed on the gate structure. The at least one void is disposed in the mask layer and disposed between the metal gate electrode and the spacer.

According to an embodiment of the present invention, a manufacturing method of a semiconductor device is provided. The manufacturing method includes the following steps. A gate structure is formed on a substrate and formed in a trench surrounded by a spacer. The gate structure includes a metal gate electrode, and a topmost surface of the spacer is higher than a topmost surface of the metal gate electrode. A mask layer is formed on the gate structure and formed in the trench. At least one void is formed in the mask layer within the trench, and the at least one void is formed between the metal gate electrode and the spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a manufacturing method of a semiconductor device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIG. 6 is a schematic drawing illustrating a semiconductor device according to an embodiment of the present invention.

DETAILED DESCRIPTION

Figure 1:
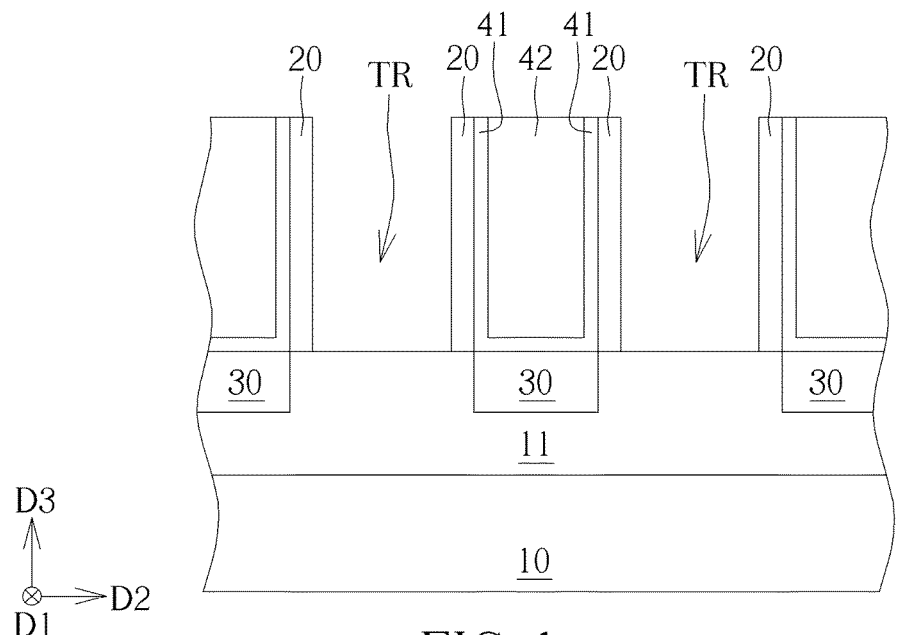
Figure 2:
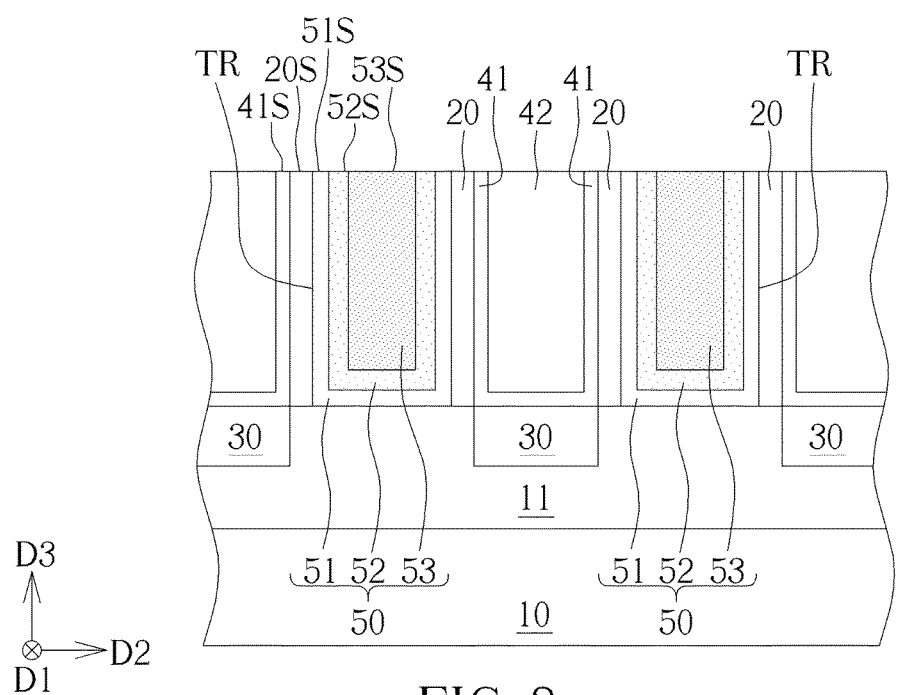

Please refer to FIGS. 1-6. FIGS. 1-6 are schematic drawings illustrating a manufacturing method of a semiconductor device according to an embodiment of the present invention, and FIG. 6 may be regarded as a schematic drawing illustrating the semiconductor device in this embodiment. The manufacturing method of the semiconductor device in this embodiment includes the following steps. As shown in FIG. 1 and FIG. 2, a gate structure 50 is formed on a substrate 10. The gate structure 50 is formed in a trench TR surrounded by a spacer 20. In some embodiments, a semiconductor structure 11 may be formed on the substrate 10 first. The substrate 10 may include a silicon substrate, an epitaxial silicon substrate, a silicon germanium substrate, a silicon carbide substrate, or a silicon-on-insulator (SOI) substrate, but not limited thereto. The semiconductor structure 11 may be a semiconductor layer, a semiconductor fin structure, or other appropriate semiconductor structures. In some embodiments, a plurality of the gate structures 50 may be formed on the semiconductor structure 11. Each of the gate structures 50 may include a gate line extending in a first direction D1, and the gate structures 50 may be disposed parallel to one another and repeatedly disposed on a second direction D2. The first direction D1 may be substantially orthogonal to the second direction D2, but not limited thereto. In some embodiments, the gate structures 50 may be formed by a replacement metal (RMG) gate process, but not limited thereto. For example, a plurality of dummy gates (not shown) may be formed in the semiconductor structure 11 first, and the spacer 20 may then be formed on the sidewalls of the dummy gates. A plurality of source/drain structures 30 may be formed in the semiconductor structure 11 by using the spacer 20 as a mask. An etching stop layer 41 and a dielectric layer 42 may then be formed covering the dummy gates and the source/drain structures 30. A planarization process, such as a chemical mechanical polishing (CMP) process, may be performed to remove the etching stop layer 41 and the dielectric layer 42 above the dummy gates in a third direction D3 perpendicular to the substrate 10 for exposing the dummy gates, and the dummy gates may be removed to form the trenches TR. The third direction D3 may be regarded as a thickness direction of the substrate 10, but not limited thereto. Subsequently, a plurality of required material layers may be sequentially formed in the trench TR, and another planarization process may be performed to remove the material layers outside the trench TR and form the gate structure 50. In some embodiments, the material of the spacer 20 may include silicon nitride ($SiN_x$), silicon carbon nitride (SiCN), silicon-carbon-oxy-nitride (SiCON), or other suitable insulation materials. The material of the etching stop layer 41 may include silicon nitride of other suitable insulation materials. The source/drain structure 30 may include an epitaxial layer, a silicide layer, a doped region in the semiconductor structure 11, or other kinds of source/drain structures.

Figure 3:
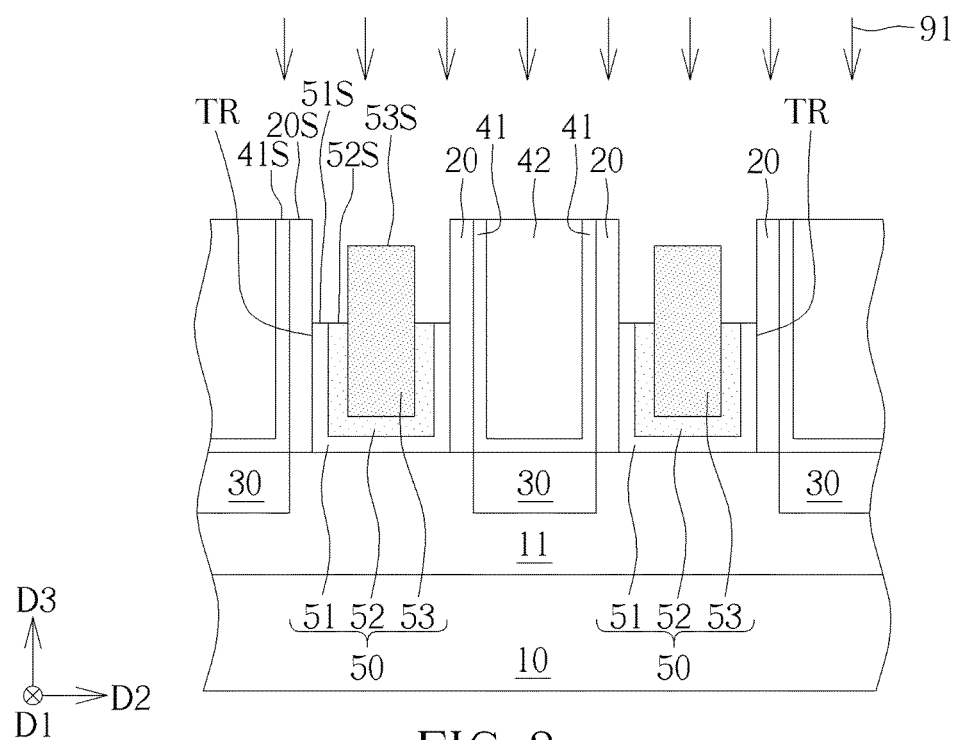

As shown in FIG. 2 and FIG. 3, an etching back process 91 is then performed to the gate structure 91 for etching at least a part of the material layers in the gate structure 50. For example, in some embodiments, each of the gate structures 50 may include a metal gate electrode 53 and a work function layer 52. The work function layer 52 may encompasses the metal gate electrode 53. In some embodiments, a topmost surface of the spacer 20 (such as a first topmost surface 20S shown in FIG. 2), a topmost surface of the etching stop layer 41 (such as a second topmost surface 41S shown in FIG. 2), a topmost surface of the metal gate electrode 53 (such as a third topmost surface 53S shown in FIG. 2), and a topmost surface of the work function layer (such as a fourth topmost surface 52S shown in FIG. 2) may be substantially located at the same level in the third direction D3 before the etching back process 91, but not limited thereto. By adjusting the etching selectivity of the etching back process 91 and/or using different etching steps in the etching back process 91, the first topmost surface 20S of the spacer 20 and the second topmost surface 41S of the etching stop layer 41 may be higher than the third topmost surface 53S of the metal gate electrode 53 after the etching back process 91, and the fourth topmost surface 52S of the work function layer 52 may be lower than the third topmost surface 53S of the metal gate electrode 53 in the third direction D3 after the etching back process 91.

In other words, the etching rate of the work function layer 52 in the etching back process 91 may be higher than the etching rate of the metal gate electrode 53 in the etching back process 91, and the work function layer 52 may be etched back more seriously than the metal gate electrode 53 in the etching back process 91 for forming the condition shown in FIG. 3 where the metal gate electrode 53 is higher than the work function layer 52. Specifically, in the trench TR, a part of the work function layer 52 may be located between the metal gate electrode 53 and the substrate 10 in the third direction D3, the work function layer 52 may encompass the metal gate electrode 53 in a horizontal direction (such as the first direction D1 and/or the second direction D2), and the work function layer 52 may include a U-shaped structure in a cross-sectional view, but not limited thereto. Additionally, the fourth topmost surface 52S of the work function layer 52 is not covered by the metal gate electrode 53 in the third direction D3 after the etching back process 91 because the third topmost surface 53S of the metal gate electrode 53 and the fourth topmost surface 52S of the work function layer 52 may be substantially located at the same level in the third direction D3 before the etching back process 91. The metal gate electrode 53 may include a low resistivity metal material, such as aluminum (Al), tungsten (W), copper (Cu), titanium aluminide (TiAl), or other suitable low resistivity metal materials. The wok function layer 52 may include tantalum nitride (TaN), titanium nitride (TiN), titanium carbide (TiC), titanium alu- minide (TiAl), titanium aluminum carbide (TiAlC), or other suitable N type work function materials and/or P type work function materials.

Additionally, as shown in FIG. 2 and FIG. 3, in some embodiments, each of the gate structures 50 may further include a gate dielectric layer 51 encompassing the metal gate electrode 53. The gate dielectric layer 51 may include a high dielectric constant (high-k) material, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. Additionally, in some embodiments, a barrier layer (not shown) may be formed between the gate dielectric layer 51 and the work function layer 52 according to other considerations. A topmost surface of the gate dielectric layer 51 (such as a fifth topmost surface 51S shown in FIG. 2) and the third topmost surface 53S of the metal gate electrode 53 may be substantially located at the same level in the third direction D3 before the etching back process 91, but not limited thereto. By adjusting the etching selectivity of the etching back process 91 and/or using different etching steps in the etching back process 91, the fifth topmost surface 51S of the gate dielectric layer 51 may be lower than the third topmost surface 53S of the metal gate electrode 53 after the etching back process 91.

In other words, the etching rate of the gate dielectric layer 51 in the etching back process 91 may be higher than the etching rate of the metal gate electrode 53 in the etching back process 91, and the gate dielectric layer 51 may be etched back more seriously than the metal gate electrode 53 in the etching back process 91 for forming the condition shown in FIG. 3 where the metal gate electrode 53 is higher than the gate dielectric layer 51. Additionally, the fifth topmost surface 51S of the gate dielectric layer 51 is not covered by the metal gate electrode 53 in the third direction D3 after the etching back process 91 because the third topmost surface 53S of the metal gate electrode 53 and the fifth topmost surface 51S of the gate dielectric layer 51 may be substantially located at the same level in the third direction D3 before the etching back process 91. In the trench TR, a part of the gate dielectric layer 51 may be located between the work function layer 52 and the substrate 10 in the third direction D3, the gate dielectric layer 51 may encompass the metal gate electrode 53 and the work function layer 52 in a horizontal direction (such as the first direction D1 and/or the second direction D2), and the gate dielectric layer 51 may include a U-shaped structure in a cross-sectional view, but not limited thereto. The above-mentioned method of forming the gate dielectric layer 51 may be regarded as a high-k last process, but not limited thereto. In some embodiments of the present invention, a high-k first process may also be applied, and the gate dielectric layer formed by the high-k first process will not have a U-shaped structure and will not surround the metal gate electrode 53 and the work function layer 52 in the horizontal direction.

Figure 4:
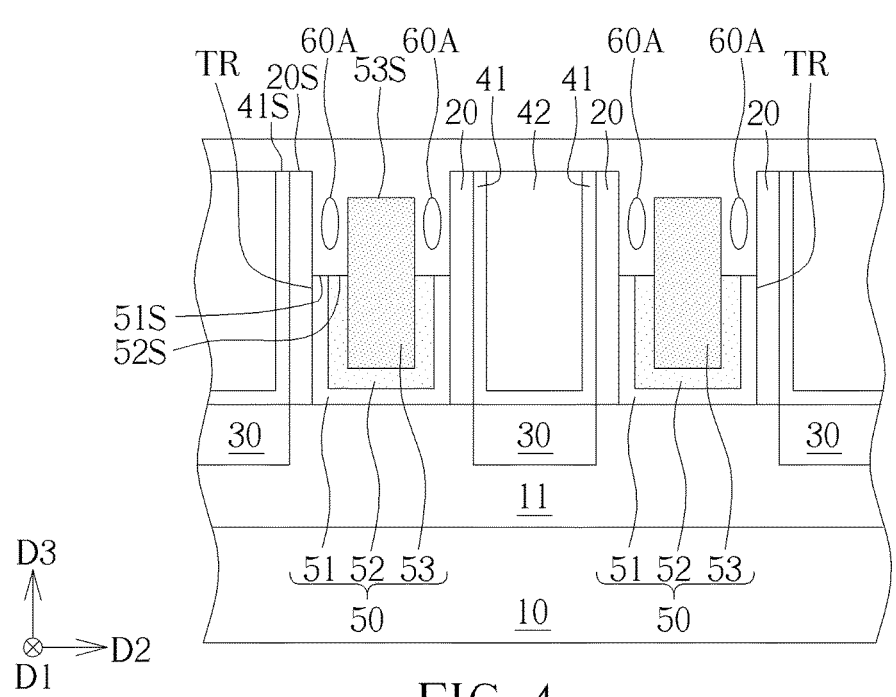
Figure 5:
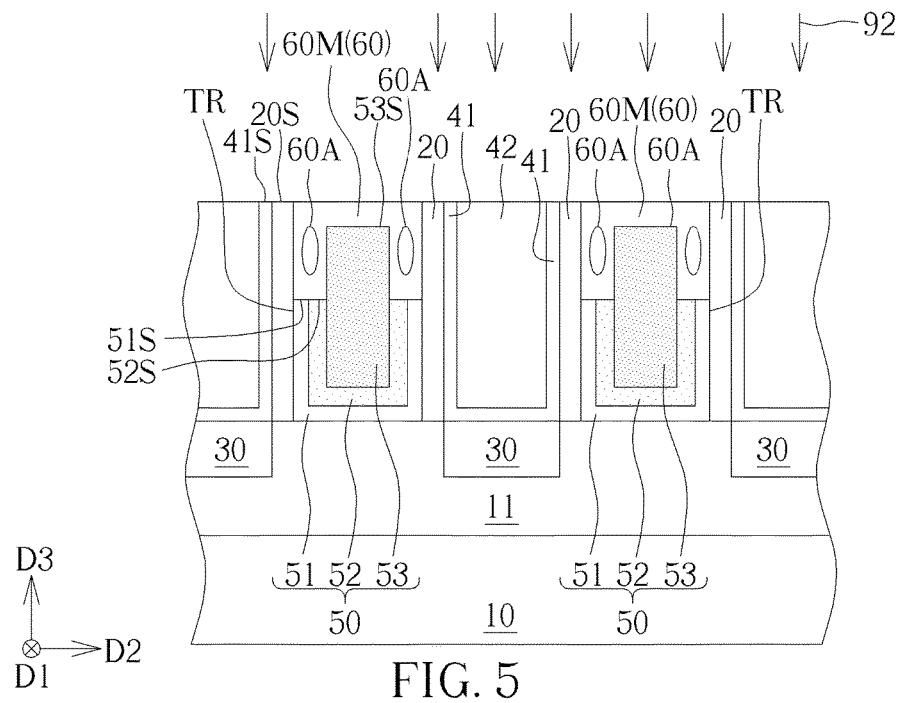

As shown in FIGS. 3-5, a mask layer 60M is formed in the trench TR and formed on each of the gate structures 50 after the etching back process 91. At least one void 60A is formed in the mask layer 60 within the trench TR, and the at least one void 60A is formed between the metal gate electrode 53 and the spacer 20 in the horizontal direction (such as the first direction D1 and/or the second direction D2). Specifically, in some embodiments, the mask layer 60M may be formed by filling the trench TR with an insulation material 60 and removing the insulation material 60 outside the trench TR by a removing process 90 (such as another CMP process), but not limited thereto. A narrow spacer may be formed in the trench TR and formed between the spacer 20 and the metal gate electrode 53 because the fourth topmost surface 52S of the work function layer 52 and the fifth topmost surface 51S of the gate dielectric layer 51 become lower than the third topmost surface 53S of the metal gate electrode 53 by the etching back process mentioned above. By selecting the material of the insulation material 60, selecting the process of forming the insulation material 60, and/or modifying the process parameters of the process of forming the insulation material 60, the void 60A may be formed after filling the trench TR with the insulation material 60 when the narrow space cannot be completely filled with the insulation material 60. Accordingly, at least a part of the void 60A is lower than the third topmost surface 53S of the metal gate electrode 53 in the third direction D3. In addition, the insulation material 60 may include silicon nitride ($SiN_x$) or other insulation materials with relatively poor gap-filling ability, but not limited thereto. In some embodiments, the void 60A may be formed between the metal gate electrode 53 and the etching stop layer 41 in the horizontal direction (such as the second direction D2), and the void 60A may be formed above the fourth topmost surface 52S of the work function layer 52 and/or the fifth topmost surface 51S of the gate dielectric layer 51S in the third direction D3. In some embodiments, a plurality of the voids 60A may be formed in the mask layer 60M within the trench TR, and at least two of the voids 60A may be formed at two opposite sides of the metal gate electrode 53 respectively in the horizontal direction (such as the second direction D2).

Figure 6:
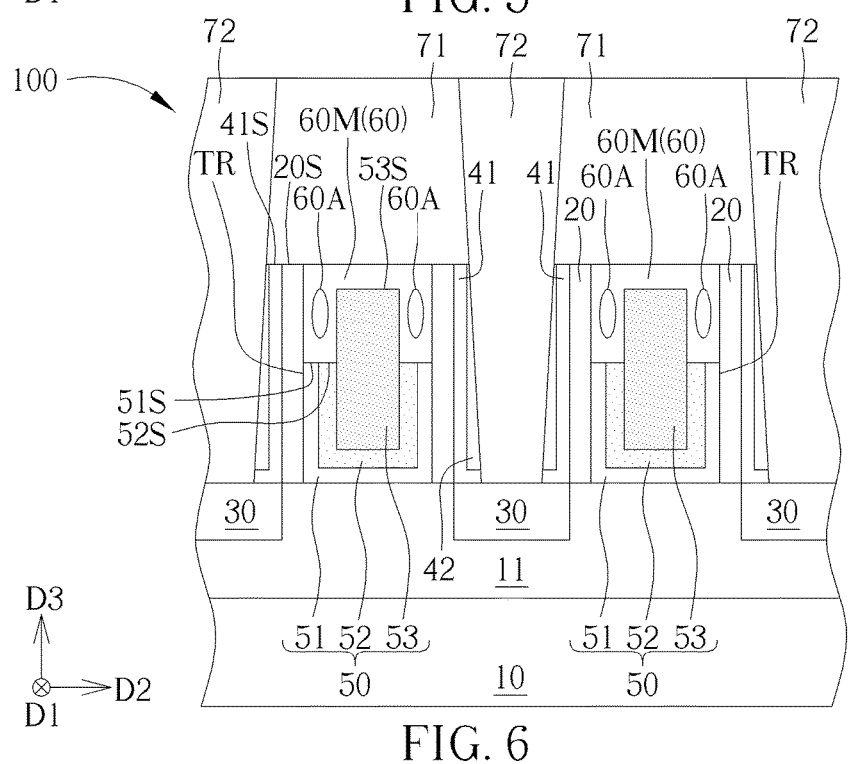

As shown in FIG. 6, an interlayer dielectric 71 may be formed and cover the spacer 20, the etching stop layer 41, the dielectric layer 42, and the mask layer 60M after the step of forming the mask layer 60M and the voids 60A, and a plurality of contact structures 72 penetrating the interlayer dielectric 71, the dielectric layer 42, and the etching stop layer 41 may be formed for being connected with and being electrically connected with the corresponding source/drain structures 30. In some embodiments, the contact structures 72 may be formed by a self-aligned approach, but not limited thereto. The semiconductor device 100 shown in FIG. 6 may be formed by the manufacturing method described above. The semiconductor device 100 includes the substrate 10, the gate structure 50, the spacer 20, the mask layer 60M, and at least one void 60A. The gate structure 50 is disposed on the substrate 10, and the gate structure 50 includes a metal gate electrode 53. The spacer 20 is disposed on sidewalls of the gate structure 50, and the first topmost surface 20S of the spacer 20 is higher than the third topmost surface 53S of the metal gate electrode 53 in the third direction D3. The mask layer 60M is disposed on the gate structure 50, and the void 60A is disposed in the mask layer 60M and disposed between the metal gate electrode 53 and the spacer 20 in the horizontal direction (such as the second direction D2). Additionally, the gate structure 50 may further include the work function layer 52 and the gate dielectric layer 51. In some embodiments, the work function layer 52 may encompass a lower portion of the metal gate electrode 53, and the fourth topmost surface 52S of the work function layer 52 may be lower than the third topmost surface 53S of the metal gate electrode 53 in the third direction D3. In some embodiments, the gate dielectric layer 51 may encompass the lower portion of the metal gate electrode 53, and the fifth topmost surface 51S of the gate dielectric layer 51 may be lower than the third topmost surface 53S of the metal gate electrode 53 in the third direction D3. In a cross-sectional view of the semiconductor device 100, such as FIG. 6, the work function layer 52 may include a U-shaped structure encompassing the lower portion of the metal gate electrode 53, and the gate dielectric layer 51 may include a U-shaped structure encompassing the lower portion of the metal gate electrode 53, but not limited thereto. The fourth topmost surface 52S of the work function layer 52 may be not covered by the metal gate electrode 53, and the at least one void 60A may be disposed above the fourth topmost surface 52S of the work function layer 52 in the third direction D3. The fifth topmost surface 51S of the gate dielectric layer 51 may be not covered by the metal gate electrode 53, and the at least one void 60A may be disposed above the fifth topmost surface 551S of the gate dielectric layer 51 in the third direction D3. The void 60A may be formed in the narrow space located in the trench TR and located between the metal gate electrode 53 and the spacer 20 because the fourth topmost surface 52S of the work function layer 52 and/or the fifth topmost surface 51S of the gate dielectric layer 51 is lower than the third topmost surface 53S of the metal gate electrode 53, and at least a part of the void 60A may be lower than the third topmost surface 53S of the metal gate electrode 53 in the third direction D3.

In addition, the semiconductor device 100 may further include the source/drain structure 30, the etching stop layer 41, and the contact structure 72. The source/drain structure 30 is disposed adjacent to the spacer 20, the etching stop layer 41 is disposed on the source/drain structure 30, and the contact structure 72 penetrates the etching stop layer 41 for being connected with and electrically connected with the corresponding source/drain structure 30. The second topmost surface 41S of the etching stop layer 41 may be higher than the third topmost surface 53S of the metal gate electrode 53 in the third direction D3, and the at least one void 60A may be disposed between the metal gate electrode 53 and the etching stop layer 41 in the horizontal direction (such as the second direction D2). In some embodiments, the semiconductor device 100 may include a plurality of the voids 60A disposed in the mask layer 60M, and at least two of the voids 60A may be disposed at two opposite sides of the metal gate electrode 53 respectively in the horizontal direction (such as the second direction D2), but not limited thereto. The void 60A in the mask layer 60M may be regarded as an air gap, the void 60A may be used to enhance the insulation effect between the contact structure 72 and the gate structure 50, and the purpose of improving the electrical performance of the semiconductor device 100 may be achieved accordingly.

To summarize the above descriptions, in the semiconductor device and the manufacturing method thereof in the present invention, the topmost surface of the work function layer and/or the topmost surface of the gate dielectric layer may be lower than the topmost surface of the metal gate electrode, and the topmost surface of the metal gate electrode may be lower than the topmost surface of the spacer after the etching back process by adjusting the etching selectivity of the etching back process. Therefore, a narrow space may be formed between the metal gate electrode and the spacer before the step of forming the mask layer on the metal gate electrode, and the void may be formed in this space by forming the mask layer on the gate structure with insulation material having relatively poor gap-filling ability and/or process having relatively poor gap-filling ability. The void formed between the metal gate electrode and the spacer may be used to enhance the insulation effect between the gate structure and the contact structure corresponding to the source/drain structure, and the electrical performance of the semiconductor device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a gate structure disposed on the substrate, wherein the gate structure comprises a metal gate electrode and a gate dielectric layer encompassing a lower portion of the metal gate electrode;
   a spacer disposed on sidewalls of the gate structure, wherein a topmost surface of the spacer is higher than a topmost surface of the metal gate electrode;
   a mask layer disposed on the gate structure;
   at least one void disposed in the mask layer and disposed between the metal gate electrode and the spacer, wherein the bottom surface of the mask layer and the top surface of the gate dielectric layer are coplanar;
   a source/drain structure disposed adjacent to the spacer;
   an etching stop layer disposed on the source/drain structure; and
   a contact structure penetrating the etching stop layer, wherein the etching stop layer and the spacer are disposed between the at least one void and the contact structure.

2. The semiconductor device according to claim 1, wherein the gate structure further comprises a work function layer encompassing a lower portion of the metal gate electrode, and a topmost surface of the work function layer is lower than the topmost surface of the metal gate electrode.

3. The semiconductor device according to claim 2, wherein the topmost surface of the work function layer is not covered by the metal gate electrode, and the at least one void is disposed above the topmost surface of the work function layer.

4. The semiconductor device according to claim 2, wherein the work function layer comprises a U-shaped structure encompassing the lower portion of the metal gate electrode.

5. The semiconductor device according to claim 1, wherein a topmost surface of the gate dielectric layer is lower than the topmost surface of the metal gate electrode.

6. The semiconductor device according to claim 5, wherein the topmost surface of the gate dielectric layer is not covered by the metal gate electrode, and the at least one void is disposed above the topmost surface of the gate dielectric layer.

7. The semiconductor device according to claim 5, wherein the gate dielectric layer comprises a U-shaped structure encompassing the lower portion of the metal gate electrode.

8. The semiconductor device according to claim 1, wherein a topmost surface of the etching stop layer is higher than the topmost surface of the metal gate electrode, and the at least one void is disposed between the metal gate electrode and the etching stop layer.

9. The semiconductor device according to claim 1, further comprising a plurality of the voids disposed in the mask layer, wherein at least two of the voids are disposed at two opposite sides of the metal gate electrode respectively.

10. The semiconductor device according to claim 1, wherein at least a part of the at least one void is lower than the topmost surface of the metal gate electrode.

* * * * *